(12) United States Patent
Goma et al.

(10) Patent No.: US 10,018,659 B2
(45) Date of Patent: Jul. 10, 2018

(54) FREQUENCY CHARACTERISTIC MEASUREMENT METHOD

(71) Applicant: Murata Manufacturing Co., Ltd., Nagaokakyo-shi, Kyoto-fu (JP)

(72) Inventors: Shinji Goma, Nagaokakyo (JP); Keiichi Ichikawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 280 days.

(21) Appl. No.: 15/134,844

(22) Filed: Apr. 21, 2016

(65) Prior Publication Data

US 2016/0252553 A1 Sep. 1, 2016

Related U.S. Application Data

(63) Continuation of application No. PCT/JP2014/079291, filed on Nov. 5, 2014.

(30) Foreign Application Priority Data

Nov. 13, 2013 (JP) .................................. 2013-234867
Feb. 27, 2014 (JP) .................................. 2014-036938

(51) Int. Cl.
*H02J 50/05* (2016.01)
*G01R 23/04* (2006.01)
(Continued)

(52) U.S. Cl.
CPC ............. *G01R 23/04* (2013.01); *G01R 23/16* (2013.01); *G01R 29/0878* (2013.01);
(Continued)

(58) Field of Classification Search
CPC ...................................................... H02J 50/05
See application file for complete search history.

(56) References Cited

U.S. PATENT DOCUMENTS

2009/0302690 A1\* 12/2009 Kubono .................. H02J 17/00
307/109
2010/0109445 A1\* 5/2010 Kurs ..................... B60L 11/007
307/104

(Continued)

FOREIGN PATENT DOCUMENTS

JP 2013187963 A 9/2013
WO WO 2013054800 A1 4/2013
WO WO 2013132702 A1 9/2013

OTHER PUBLICATIONS

International Search Report issued for PCT/JP2014/079291, dated Jan. 6, 2015.

(Continued)

*Primary Examiner* — Clayton E Laballe
*Assistant Examiner* — Jas Sanghera
(74) *Attorney, Agent, or Firm* — Arent Fox LLP

(57) ABSTRACT

A power transmission-side measurement tool is installed in a power transmitting apparatus that applies an AC voltage stepped up by a step-up transformer to an active electrode and a passive electrode. The power transmission-side measurement tool includes a measurement active electrode that faces the active electrode and a measurement passive electrode that faces the passive electrode, and the measurement active electrode and measurement passive electrode are shorted together. Frequency characteristics of a serial resonance circuit formed by leakage inductance of the step-up transformer and capacitors are measured in a state where the power transmission-side measurement tool is placed on the power transmitting apparatus.

30 Claims, 10 Drawing Sheets

(51) Int. Cl.
*H02J 50/70* (2016.01)
*H02J 7/02* (2016.01)
*G01R 23/16* (2006.01)
*H02J 50/10* (2016.01)
*G01R 29/08* (2006.01)

(52) U.S. Cl.
CPC .............. *H02J 7/025* (2013.01); *H02J 50/05* (2016.02); *H02J 50/10* (2016.02); *H02J 50/70* (2016.02)

(56) References Cited

U.S. PATENT DOCUMENTS

2014/0175907 A1    6/2014   Takahashi et al.
2014/0354075 A1    12/2014   Suesada et al.

OTHER PUBLICATIONS

Written Opinion of the International Searching Authority issued for PCT/JP2014/079291, dated Jan. 6, 2015.

* cited by examiner f1 : 452.5 kHz
Δf1 : 6.439 kHz
Q : 70.25196 f2 : 451.25 kHz
Δf2 : 6.792 kHz
Q : 66.42153 f1 : 498.6 kHz
Δf1 : 8.317 kHz
Q : 59.98751 f2 : 519.2 kHz
Δf2 : 7.698 kHz
Q : 67.4353

FREQUENCY CHARACTERISTIC MEASUREMENT METHOD

CROSS REFERENCE TO RELATED APPLICATIONS

The present application is a continuation of International application No. PCT/JP2014/079291, filed Nov. 5, 2014, which claims priority to Japanese Patent Application No. 2013-234867, filed Nov. 13, 2013 and Japanese Patent Application No. 2014-036938, filed Feb. 27, 2014, the entire contents of each of which are incorporated herein by reference.

TECHNICAL FIELD

The present invention relates to a frequency characteristic measurement method that, in a power transmission system that transmits power from a power transmitting apparatus to a power receiving apparatus using electric field coupling, measures frequency characteristics of both the power transmitting and the power receiving apparatus.

BACKGROUND ART

A system such as that disclosed in International Publication No. WO 2013/054800, which transmits power from a power transmitting apparatus to a power receiving apparatus by disposing an active electrode of the power transmitting apparatus and an active electrode of the power receiving apparatus so as to face one another, coupling the two electrodes by forming a strong electric field between the electrodes, and using the electric field coupling, is known as an example of an electric field coupling-type wireless power transmission system. This electric field coupling-type wireless power transmission system can transmit power between the power transmitting apparatus and the power receiving apparatus with a high transmission efficiency. The power receiving apparatus can also be placed relative to the power transmitting apparatus with a comparatively high degree of freedom, and furthermore, the apparatuses can be made smaller and thinner.

SUMMARY OF INVENTION

In the wireless power transmission system disclosed in International Publication No. WO 2013/054800, it is necessary to set the resonance characteristics of resonance circuits formed in the power transmitting apparatus and the power receiving apparatus, respectively, to desired characteristics in order to increase the efficiency of power transmission. When designing power transmitting and power receiving apparatus to be used together, the prior art measures the resonance characteristics of the power transmitting and power receiving apparatus while the power receiving apparatus is placed on the power transmitting apparatus (i.e., when the power receiving apparatus and the power transmitting apparatus are operatively engaged). In this case, however, it is only possible to measure the combined characteristics of the power transmitting apparatus and the power receiving apparatus. There is thus a problem that variation between the resonance characteristics of the individual apparatuses increases, resulting in increased variation in the efficiency of power transmission, as compared to a case where the settings are made individually.

Accordingly, it is an object of the present invention to provide a frequency characteristic measurement method capable of individually measuring frequency characteristics of a power transmitting apparatus and a power receiving apparatus in a wireless power transmission system.

A frequency characteristic measurement method according to the present invention measures frequency characteristics of a power transmitting apparatus in a wireless power transmission system that transmits power from the power transmitting apparatus to a power receiving apparatus through electric field coupling. The system includes the power transmitting apparatus, having a high-frequency generating circuit, a power transmission resonance circuit connected to the high-frequency generating circuit, and a first electrode and a second electrode connected to an output side of the power transmission resonance circuit, and the power receiving apparatus, having a third electrode that faces the first electrode with a gap there between, a fourth electrode that faces the second electrode with a gap there between or makes contact with the second electrode, and a power reception resonance circuit connected to the third electrode and the fourth electrode. Frequency characteristics of the power transmission resonance circuit are measured between the high-frequency generating circuit and the power transmission resonance circuit by placing, on the power transmitting apparatus, a power transmission-side measurement tool that has a measurement first electrode facing the first electrode with a gap there between and a measurement second electrode facing the second electrode with a gap there between or making contact with the second electrode and in which the measurement first electrode and the measurement second electrode are connected.

According to this measurement method, using the power transmission-side measurement tool makes it possible to measure the frequency in a state where the resonance circuit on the power transmitting apparatus side is not coupled with the resonance circuit on the power receiving apparatus side, or in other words, makes it possible to measure the frequency characteristics for only the resonance circuit on the power transmitting apparatus side. As such, in the case where circuit design is carried out for the power transmitting apparatus on the basis of a result of the measurement, the circuit design can be carried out for the power transmitting apparatus regardless of the circuit configuration of the power receiving apparatus, which makes it possible to manufacture a highly-generic power transmitting apparatus.

It is preferable that the frequency characteristics be a resonant frequency of the power transmission resonance circuit and a Q value.

According to this measurement method, the resonant frequency of the power transmission resonance circuit and the Q value are obtained through the measurement, and thus by carrying out the circuit design on the basis of that result, a generic power transmitting apparatus having high power transmission efficiency can be manufactured.

In the measurement method, it is preferable that the frequency characteristics be measured in a state in which the measurement first electrode and the measurement second electrode are shorted together.

According to this measurement method, the power transmission-side measurement tool can be realized through a simple configuration, and it is possible to measure only the frequency characteristics of the power transmission resonance circuit.

In the measurement method, it is preferable that the frequency characteristics be measured in a state in which the measurement first electrode and the measurement second electrode are connected with a capacitance interposed there between.

According to this measurement method, resonance conditions of the power transmission resonance circuit can be adjusted (corrected), and thus a result of measuring the frequency characteristics can be obtained in a state close to an actual usage state.

In the measurement method, it is preferable that the frequency characteristics be measured in a state in which the first electrode, the second electrode, the measurement first electrode, and the measurement second electrode are interposed between a power transmission-side ground electrode provided in the power transmitting apparatus and connected to a ground potential of the power transmitting apparatus and a power reception side ground electrode provided in the power transmission-side measurement tool and connected to the ground potential of the power transmitting apparatus.

According to this measurement method, by interposing the electrodes between the ground electrodes, a result of measuring the frequency characteristics can be obtained in a state close to an actual usage state.

A frequency characteristic measurement method according to the present invention measures frequency characteristics of a power receiving apparatus in a wireless power transmission system that transmits power from a power transmitting apparatus to the power receiving apparatus through electric field coupling. The system includes the power transmitting apparatus, having a high-frequency generating circuit, a power transmission resonance circuit connected to the high-frequency generating circuit, and a first electrode and a second electrode connected to an output side of the power transmission resonance circuit, and the power receiving apparatus, having a third electrode that faces the first electrode with a gap there between, a fourth electrode that faces the second electrode with a gap there between or makes contact with the second electrode, a power reception resonance circuit in which the third electrode and the fourth electrode are connected to an input side thereof, and a rectifying circuit connected to an output side of the power reception resonance circuit. Frequency characteristics of the power reception resonance circuit are measured between the power reception resonance circuit and the rectifying circuit by installing, for the power receiving apparatus, a power reception side measurement tool that has a measurement third electrode facing the third electrode with a gap there between and a measurement fourth electrode facing the fourth electrode with a gap there between or making contact with the fourth electrode and in which the measurement third electrode and the measurement fourth electrode are connected.

According to this measurement method, using the power reception side measurement tool makes it possible to measure the frequency in a state where the resonance circuit on the power receiving apparatus side is not coupled with the resonance circuit on the power transmitting apparatus side, or in other words, makes it possible to measure the frequency characteristics for only the resonance circuit on the power receiving apparatus side. As such, in the case where circuit design is carried out for the power receiving apparatus on the basis of a result of the measurement, the circuit design can be carried out for the power receiving apparatus regardless of the circuit configuration of the power transmitting apparatus, which makes it possible to manufacture a highly-generic power receiving apparatus.

It is preferable that the frequency characteristics be a resonant frequency of the power reception resonance circuit and a Q value. According to this measurement method, the resonant frequency of the power reception resonance circuit and the Q value are obtained through the measurement, and thus by carrying out the circuit design on the basis of that result, a generic power receiving apparatus having high power transmission efficiency can be manufactured.

In the measurement method, it is preferable that the frequency characteristics be measured in a state in which the measurement third electrode and the measurement fourth electrode are shorted.

According to this measurement method, the power reception side measurement tool can be realized through a simple configuration, and it is possible to measure only the frequency characteristics of the power reception resonance circuit.

In the measurement method, it is preferable that the frequency characteristics be measured in a state in which the measurement third electrode and the measurement fourth electrode are connected with a capacitance interposed there between.

According to this measurement method, resonance conditions of the power reception resonance circuit can be adjusted (corrected), and thus a result of measuring the frequency characteristics can be obtained in a state close to an actual usage state.

In the measurement method, it is preferable that the frequency characteristics be measured in a state in which the third electrode, the fourth electrode, the measurement third electrode, and the measurement fourth electrode are interposed between a power transmission-side ground electrode provided in the power reception side measurement tool and connected to a ground potential of the power transmitting apparatus and a power reception side ground electrode provided in the power receiving apparatus and connected to the ground potential of the power transmitting apparatus.

According to this measurement method, by interposing the electrodes between the ground electrodes, a result of measuring the frequency characteristics can be obtained in a state close to an actual usage state.

Advantageous Effects of Invention

According to the present invention, an impedance of a resonance circuit in a power transmitting apparatus or an impedance of a resonance circuit in a power receiving apparatus can be measured individually. As such, in the case where circuit design is carried out for the power receiving apparatus or the power transmitting apparatus on the basis of a result of the measurement, the circuit design can be carried out for the power receiving apparatus or the power transmitting apparatus regardless of the circuit configuration of the power transmitting apparatus or the power receiving apparatus used during measurement, which makes it possible to manufacture a highly-generic power receiving apparatus or power transmitting apparatus.

The invention is further directed towards a method of designing a power transmission device having an AC generating circuit, a power transmission resonance circuit connected to the AC generating circuit, and first and second electrodes connected to an output side of the power transmission resonance circuit so that the power transmission device will have a predetermined set of frequency characteristics. The method comprises testing the frequency characteristics of a test power transmission apparatus by placing a power transmission side measurement tool having first and second measurement electrodes in operational engagement with the first and second electrodes, respectively, whereby the power transmission side measurement tool is in operational engagement with the test power transmission apparatus, and, while the power transmission side measurement tool is in operational engagement with the test power transmission apparatus, measuring the frequency characteristics of the power transmission resonance circuit at a location between the AC generating circuit and the power transmission resonance circuit to determine if they meet the predetermined set of frequency characteristics; and, if they do not. The test power transmission apparatus is then redesigned in an effort to bring its frequency characteristics closer to the predetermined set of frequency characteristics.

DESCRIPTION OF EMBODIMENTS

First Embodiment

Figure 1:
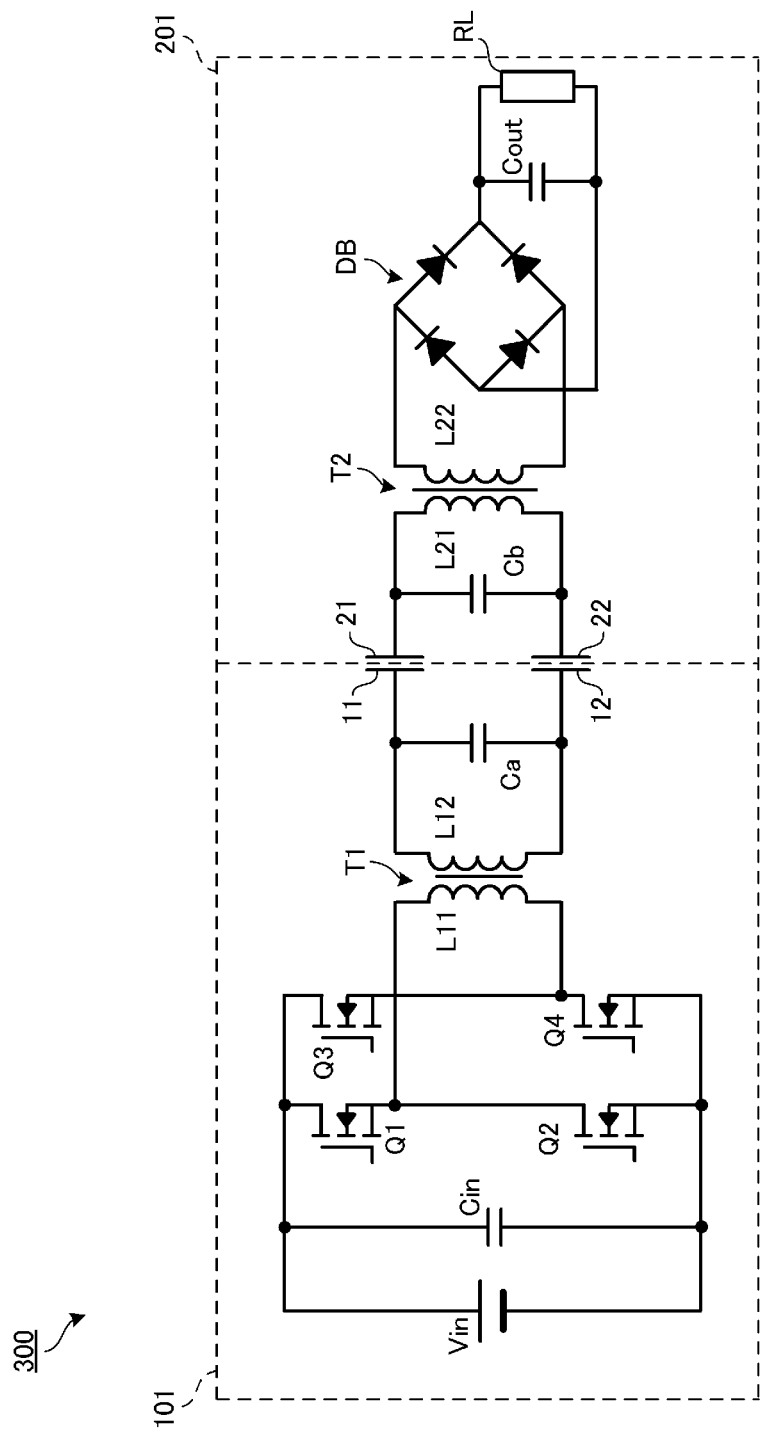
FIG. 1 is a circuit diagram illustrating a wireless power transmission system according to an embodiment of the present invention.

FIG. 1 is a circuit diagram illustrating a typical wireless power transmission system. The wireless power transmission system 300 includes a power transmitting apparatus 101 and a power receiving apparatus 201. The power receiving apparatus 201 includes a load circuit RL which, for example, is a battery module including a secondary battery and a charging circuit. The power receiving apparatus 201 is, for example, a mobile electronic device that includes the secondary battery. A cellular phone, a PDA, a portable music player, a laptop PC, a digital camera, and the like can be given as examples of such a mobile electronic device. When the power receiving apparatus 201 is physically placed upon the power transmitting apparatus 101 such that the power transmission and power receiving apparatus are operatively engaged, the power transmitting apparatus 101 transmits power to the power receiving apparatus 201. The power receiving apparatus 201 then charges the secondary battery.

The power transmitting apparatus 101 includes a DC voltage source Vin. The DC voltage source Vin outputs a DC voltage which is transformed by an AC adapter into an AC voltage. The DC voltage source Vin is preferably an AC adapter connected to a commercial power supply and transforms 100 V-240 V AC into, for example, 19 V DC. However, it is not necessary to transform into 19 V DC, and the transformation may be into, for example, 5 V or 12 V DC.

An input capacitor Cin is connected to the DC voltage source Vin. Furthermore, a DC-AC inverter circuit that transforms the DC voltage into an AC voltage is connected to the DC voltage source Vin. The DC voltage source Vin and the DC-AC inverter circuit are an example of an "AC generating circuit" (high frequency generating circuit) according to the present invention. The DC-AC inverter circuit includes switching elements Q1, Q2, Q3, and Q4, and transforms from DC to AC by repeatedly alternating between a state in which the switching elements Q1 and Q4 are on and the switching elements Q2 and Q3 are off and a state in which Q1 and Q4 are off and Q2 and Q3 are on.

Opposite ends of a primary coil L11 of a step-up transformer T1 are connected to a connection point between the switching elements Q1 and Q2 and a connection point between the switching elements Q3 and Q4, respectively. An active electrode 11 and a passive electrode 12 are connected to a secondary coil L12 of the step-up transformer T1. The step-up transformer T1 steps up the AC voltage and applies the stepped-up AC voltage between the active electrode 11 and the passive electrode 12. The frequency of this AC voltage is preferably set in a range from 100 kHz to 10 MHz.

A capacitor Ca is connected in parallel to the secondary coil L12 of the step-up transformer T1. In the case where there is stray capacitance arising or a capacitor is connected between the active electrode 11 and the passive electrode 12, the capacitor Ca has a combined capacitance of the capacitance of that capacitor and the stray capacitance. The capacitor Ca forms a serial resonance circuit with a leakage inductance (not illustrated) of the secondary coil L12. This serial resonance circuit is an example of a "power transmission resonance circuit" according to the present invention.

The power receiving apparatus 201 includes an active electrode 21 and a passive electrode 22. The active electrode 21 and the passive electrode 22 face the active electrode 11 and the passive electrode 12 of the power transmitting apparatus 101 preferably with a gap there between when the power receiving apparatus 201 has been placed on the power transmitting apparatus 101 in operative engagement with the power transmitting apparatus 101. Note that the passive electrodes 12 and 22 may be in direct contact.

Opposite ends of a primary coil L21 of a step-down transformer T2 are connected to the active electrode 21 and the passive electrode 22, respectively. A capacitor Cb is connected in parallel with the primary coil L21. In the case where there is stray capacitance or a capacitor is connected between the active electrode 21 and the passive electrode 22, the capacitor Cb has a combined capacitance of the capacitance of that capacitor and the stray capacitance. The capacitor Cb forms a parallel resonance circuit with magnetization inductance of the primary coil L21 in the step-down transformer T2. This parallel resonance circuit is an example of a "power reception resonance circuit" according to the present invention.

When the power receiving apparatus 201 is placed on the power transmitting apparatus 101 in operative engagement therewith and a voltage is applied between the active electrode 11 and the passive electrode 12 of the power transmitting apparatus 101, the active electrodes 11 and 21 and the passive electrodes 12 and 22 that now face each other are capacitively coupled, producing an electric field. Power is then transmitted from the power transmitting apparatus 101 to the power receiving apparatus 201 through this electric field. In the power receiving apparatus 201, the AC voltage induced through the power transmission is stepped down by the step-down transformer T2, is rectified and smoothed by a diode bridge DB and a smoothing capacitor Cout, and is then applied to the load circuit RL.

In the wireless power transmission system 300 configured as described above, the serial resonance circuit formed in the power transmitting apparatus 101 and the parallel resonance circuit formed in the power receiving apparatus 201 are set to have substantially the same resonant frequency. Those resonance circuits undergo coupled resonance (combined resonance) when the power receiving apparatus 201 is placed in operative engagement with the power transmitting apparatus 101. Power can be transmitted efficiently by ensuring that the resonant frequencies of the serial resonance circuit and the parallel resonance circuit match. Note that a driving frequency used in the power transmission at this time is set in the vicinity of the resonant frequencies of the serial resonance circuit and the parallel resonance circuit.

Methods for measuring the resonant frequency of the serial resonance circuit of the power transmitting apparatus 101 and the resonant frequency of the parallel resonance circuit of the power receiving apparatus 201, respectively, will now be described.

As described above, it is desirable to carry out the circuit design of the serial resonance circuit formed in the power transmitting apparatus 101 and the parallel resonance circuit formed in the power receiving apparatus 201 so that the respective resonant frequencies thereof substantially match. Conventionally, the frequency characteristics have been measured on the power transmitting apparatus 101 side, with the power receiving apparatus 201 placed on the power transmitting apparatus 101 and the serial resonance circuit and parallel resonance circuit in an operatively coupled state. Each circuit is then designed on the basis of the result of that measurement.

In this case, the circuit design for the power transmitting apparatus 101 is made to be efficiently coupled with the particular power receiving apparatus 201 for which it is designed. Accordingly, when a different power receiving apparatus from the power receiving apparatus 201 is placed on the power transmitting apparatus 101, the resonance conditions of the combined resonance occurring when the serial resonance circuit of the power transmitting apparatus 101 and the parallel resonance circuit of the power receiving apparatus placed on the power transmitting apparatus 101 couple may differ from those set when the circuits were designed. When the resonance conditions differ and the resonant frequency shifts, the Q value drops, or the like, and there is a risk that the efficiency of power transmission will drop. Likewise, the circuit design for the power receiving apparatus 201 is made to be efficiently coupled to the power transmitting apparatus 101, and thus there is also a risk of the efficiency of power transmission dropping in the case where the power receiving apparatus 201 is placed on a different power transmitting apparatus from the power transmitting apparatus 101.

Accordingly, the present embodiment enables impedance-frequency characteristics of the power transmitting apparatus 101 and the power receiving apparatus 201, respectively, to be measured in a state where the resonance circuits of the power transmitting apparatus 101 and the power receiving apparatus 201, respectively, are not operatively coupled. Here, the impedance-frequency characteristics are needed to find the resonant frequencies and Q values of the resonance circuits in the power transmitting apparatus 101 and the power receiving apparatus 201, respectively. The resonance circuits are designed so that the measurement result meets predetermined conditions.

Specifically, the circuit designs for the power transmitting apparatus 101 and the power receiving apparatus 201, respectively, are carried out so that the error between a measured resonant frequency and a design target value (452 kHz, in the present embodiment) is approximately ±5%, and so that a measured Q value is no less than 20. By individually measuring the frequency characteristics of the power transmitting apparatus 101 and the power receiving apparatus 201, respectively, and designing the circuits accordingly, the resonance conditions can be made uniform and the efficiency of power transmission can be improved regardless of what power receiving apparatus is placed on the power transmitting apparatus 101 and regardless of what power transmitting apparatus the power receiving apparatus 201 is placed on.

First, a method of measuring the frequency characteristics of the power transmitting apparatus 101 will be described.

Figure 2:
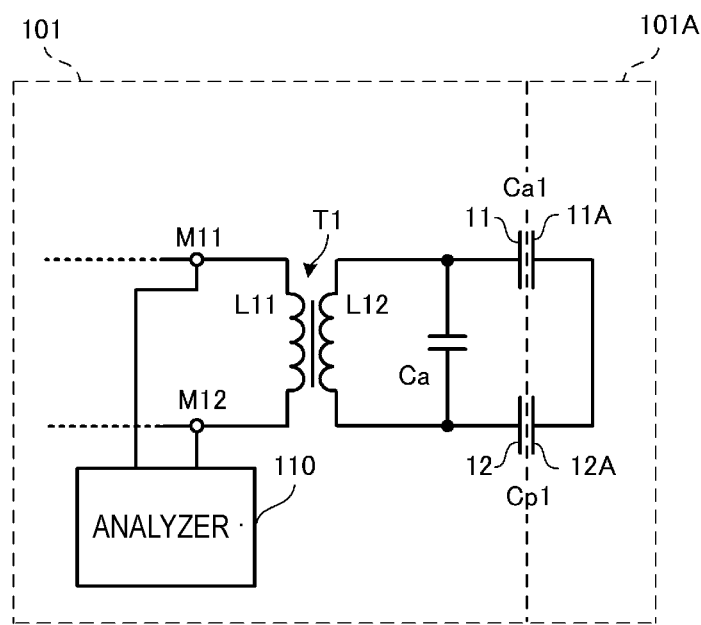
FIG. 2 is a diagram illustrating a method for measuring the frequency characteristics of a power transmitting apparatus.

FIG. 2 is a diagram illustrating a method for measuring the frequency characteristics of the power transmitting apparatus 101. The DC voltage source Vin, the DC-AC inverter circuit, and the like of the power transmitting apparatus 101 are not illustrated in FIG. 2.

When measuring the resonant frequency of the power transmitting apparatus 101, a power transmission-side measurement tool 101A is placed on (and in operative engagement with) the power transmitting apparatus 101 instead of the power receiving apparatus 201. The power transmission-side measurement tool 101A includes a measurement active electrode 11A and a measurement passive electrode 12A, and the measurement active electrode 11A and the measurement passive electrode 12A are shorted together. It is preferable that the measurement active electrode 11A and the measurement passive electrode 12A be the same size and shape as those used in the power receiving apparatus 201. A capacitor Ca1 illustrated in FIG. 2 is a capacitance formed between the active electrode 11 and the measurement active electrode 11A, whereas a capacitor Cp1 is a capacitance formed between the passive electrode 12 and the measurement passive electrode 12A.

In the present embodiment, respective end portions of the primary coil L11 in the step-up transformer T1 serve as measurement locations M11 and M12. Then, focusing on the impedance when the power transmission-side measurement tool 101A side is viewed from the measurement locations M11 and M12, an impedance analyzer (called an analyzer hereinafter) 110 is connected to the measurement locations M11 and M12, and the impedance frequency characteristics are measured.

As illustrated in FIG. 1, the power receiving apparatus 201 includes the capacitor Cb, the step-down transformer T2, the diode bridge DB, etc. When the power receiving apparatus 201 is placed on the power transmitting apparatus 101 in operative engagement therewith, the frequency characteristics are measured including the various circuits such as the step-down transformer T2 and the like. In the present embodiment, the measurement is carried out using the above-described power transmission-side measurement tool 101A, and thus the various circuits of the power receiving apparatus 201, such as the step-down transformer T2 and the like, are not included in the measured value.

To rephrase, the impedance when the power transmission-side measurement tool 101A side is viewed from the measurement locations M11 and M12 is an impedance of a resonance circuit constituted by the step-up transformer T1, the capacitor Ca, the capacitor Ca1, and the capacitor Cp1. In the case where the impedance frequency characteristics are measured by the analyzer 110, the frequency characteristics of the serial resonance circuit formed in the power transmitting apparatus 101 and the parallel resonance circuit can be measured.

The serial resonance circuit is a circuit formed by leakage inductance (not illustrated) of the step-up transformer T1, the capacitor Ca, the capacitor Ca1, the capacitor Cp1, and the like. Meanwhile, the parallel resonance circuit is a circuit formed by the secondary coil L12 of the step-up transformer T1, the capacitor Ca, the capacitor Ca1, the capacitor Cp1, and the like.

Figure 3:
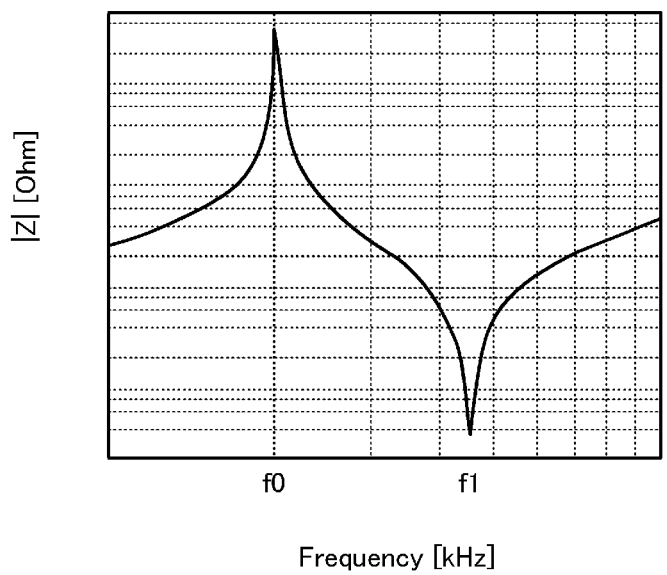
FIG. 3 is a diagram illustrating a result of measuring frequency characteristics in accordance with the present invention in the case where a power transmission-side measurement tool is used.

FIG. 3 is a diagram illustrating a result of measuring the frequency characteristics in the case where the power transmission-side measurement tool 101A is used. As illustrated in FIG. 3, a resonant frequency f0 of the parallel resonance circuit formed in the power transmitting apparatus 101 and a resonant frequency f1 of the serial resonance circuit can be detected from the result of measuring the frequency characteristics.

Figure 4:
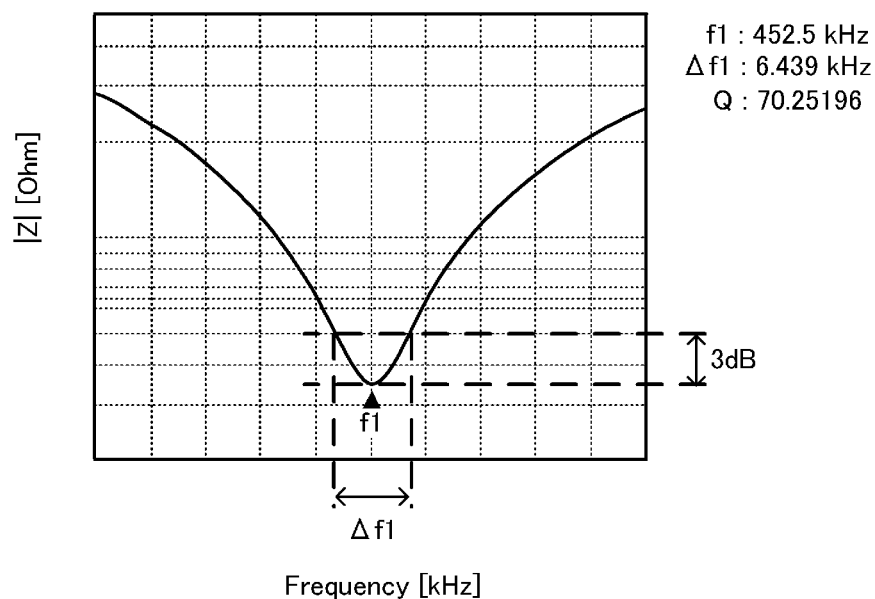
FIG. 4 is a diagram illustrating the result of measuring the frequency characteristics in the vicinity of a serial resonance circuit indicated in FIG. 3, in an enlarged manner.

FIG. 4 is a diagram illustrating the result of measuring the frequency characteristics in the vicinity of the serial resonance circuit indicated in FIG. 3, in an enlarged manner. The resonant frequency f1 of the serial resonance circuit is approximately 452 kHz. A band width $\Delta f1$ at a point corresponding to $\sqrt{2}$ times a minimum value (the resonant frequency f1) of the frequency characteristics (approximately +3 dB) is approximately 6.439 kHz. In this case, the Q value of the serial resonance circuit is found from $f1/\Delta f1$, and the value thereof is approximately 70.

On the basis of this measurement result, the serial resonance circuit of the power transmitting apparatus 101 is designed so that the resonant frequency f1 has error of approximately ±5% from the design target value (452 kHz) and the measured Q value is no less than 20. All conditions are met in the case of the measurement result indicated in FIG. 4.

Next, a method of measuring the frequency characteristics of the power receiving apparatus 201 will be described.

Figure 5:
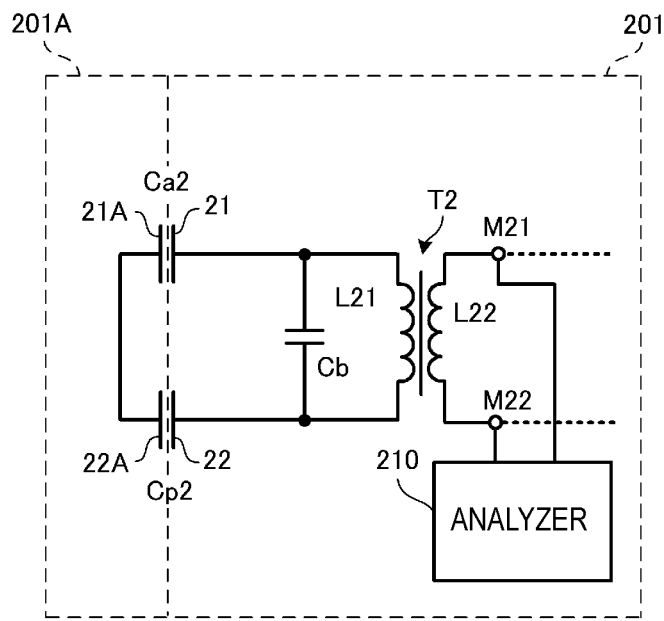
FIG. 5 is a diagram illustrating a method for measuring the frequency characteristics of a power receiving apparatus in accordance with the present invention.

FIG. 5 is a diagram illustrating a method for measuring the frequency characteristics of the power receiving apparatus 201. The diode bridge DB, the smoothing capacitor Cout, and the like of the power receiving apparatus 201 are not illustrated in FIG. 5.

When measuring the resonant frequency of the power receiving apparatus 201, a power reception side measurement tool 201A is operatively coupled to the power receiving apparatus 201 instead of the power transmitting apparatus 101. The power reception side measurement tool 201A includes a measurement active electrode 21A and a measurement passive electrode 22A which are shorted together. A capacitor Ca2 illustrated in FIG. 5 is a capacitance formed between the active electrode 21 and the measurement active electrode 21A, whereas a capacitor Cp2 is a capacitance formed between the passive electrode 22 and the measurement passive electrode 22A.

In the present embodiment, respective end portions of a secondary coil L22 in the step-down transformer T2 serve as measurement locations M21 and M22. Then, focusing on the impedance when the power reception side measurement tool 201A side is viewed from the measurement locations M21 and M22, an analyzer 210 is connected to the measurement locations M21 and M22, and the impedance frequency characteristics are measured.

As described above, the power transmitting apparatus 101 includes the capacitor Ca, the DC-AC inverter circuit, and the like. When the power receiving apparatus 201 is placed on the power transmitting apparatus 101, the frequency characteristics are measured including the various circuits such as the DC-AC inverter circuit and the like. In the present embodiment, the measurement is carried out using the above-described power reception side measurement tool 201A, and thus the DC-AC inverter circuit and the like of the power transmitting apparatus 101 are not included in the measured value.

To rephrase, the impedance when the power reception side measurement tool 201A side is viewed from the measurement locations M21 and M22 is an impedance of a circuit constituted by the step-down transformer T2, the capacitor Cb, the capacitor Ca2, and the capacitor Cp2. In the case where the impedance frequency characteristics are measured by the analyzer 210, the frequency characteristics of the parallel resonance circuit formed in the power receiving apparatus 201 and the parallel resonance can be measured. This parallel resonance circuit is a circuit formed from the magnetization inductance of the primary coil L21 in the step-down transformer T2 and the combined capacitance of the capacitor Cb, the capacitor Ca2, and the capacitor Cp2.

Figure 6:
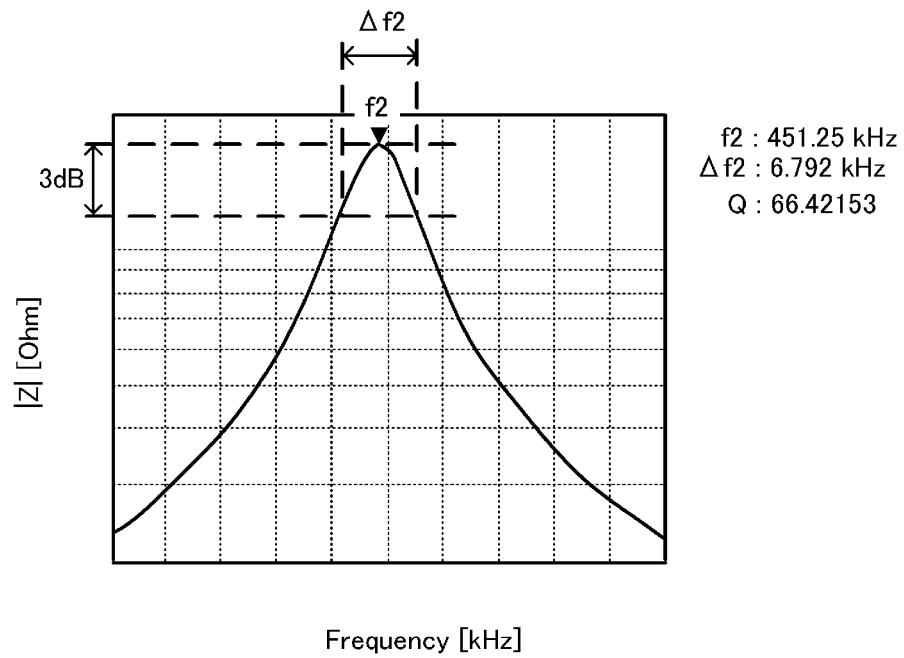
FIG. 6 is a diagram illustrating a result of measuring frequency characteristics in accordance with the present invention in the case where a power reception side measurement tool is used.

FIG. 6 is a diagram illustrating a result of measuring the frequency characteristics in the case where the power reception side measurement tool 201A is used. As illustrated in FIG. 6, a resonant frequency f2 of the parallel resonance circuit formed in the power receiving apparatus 201 can be detected from the result of measuring the frequency characteristics. The resonant frequency f2 of the parallel resonance circuit is approximately 451 kHz. Meanwhile, a band width $\Delta f2$ at a point corresponding to $1/\sqrt{2}$ times a peak value (the resonant frequency f2) of the frequency characteristics (approximately −3 dB) is approximately 6.792 kHz.

In this case, the Q value of the serial resonance circuit is found from f2/Δf2, and the value thereof is approximately 66.

On the basis of this measurement result, the parallel resonance circuit of the power receiving apparatus 201 is designed so that the resonant frequency f2 has error of approximately ±5% from the design target value (452 kHz) and the measured Q value is no less than 20. All conditions are met in the case of the measurement result indicated in FIG. 6.

The resonant frequency f1 of the power transmitting apparatus 101 measured as described above is 452 kHz, and the resonant frequency f2 of the power receiving apparatus 201 is 451 kHz. The resonant frequencies f1 and f2 have error no greater than 5% of the design target value of 452 kHz. The measured Q values are 70 and 66, and are thus both no less than 20. Accordingly, in this case, power can be transmitted efficiently when the power receiving apparatus 201 is placed on the power transmitting apparatus 101.

Meanwhile, by using the power transmission-side measurement tool 101A or the power reception side measurement tool 201A when measuring the frequency characteristics, the measurement is taken in a state where the serial resonance circuit of the power transmitting apparatus 101 and the parallel resonance circuit of the power receiving apparatus 201 are not coupled to one another, which makes it possible to measure the frequency characteristics of the power transmitting apparatus 101 and the power receiving apparatus 201 individually. Accordingly, by setting the respective resonant frequencies, Q values at resonance points, and so on to predetermined design values, the risk of a drop in the efficiency of power transmission can be reduced regardless of what power receiving apparatus is placed on the power transmitting apparatus 101. Likewise, the risk of a drop in the efficiency of power transmission can be reduced regardless of what power transmitting apparatus the power receiving apparatus 201 is placed on.

Note that when measuring the frequency characteristics, the opposing active electrodes and passive electrodes may be interposed between ground electrodes.

Figure 7:
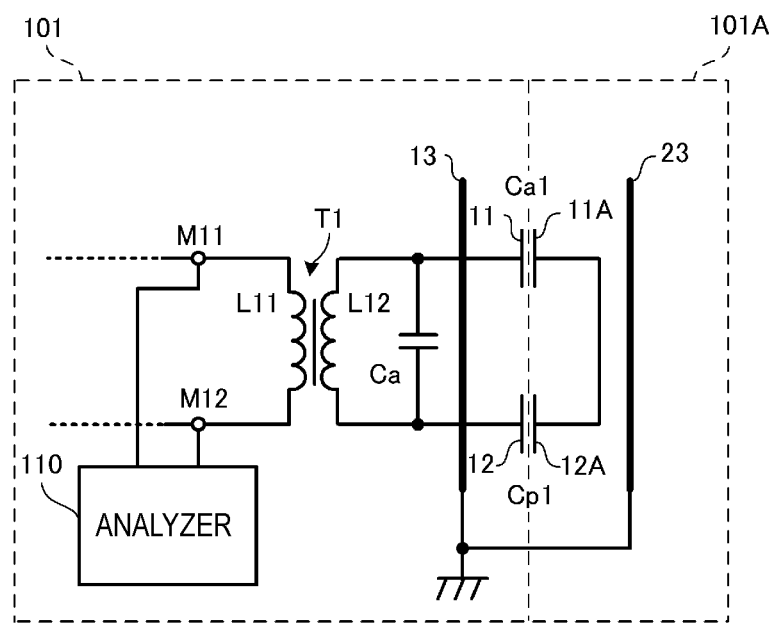
FIG. 7 is a diagram illustrating a method for measuring frequency characteristics using a ground electrode.

FIG. 7 is a diagram illustrating a method for measuring the frequency characteristics of the power transmitting apparatus using ground electrodes. The power transmitting apparatus 101 includes a ground electrode 13 provided facing the active electrode 11 and the passive electrode 12. Meanwhile, the power transmission-side measurement tool 101A includes a ground electrode 23 provided facing the measurement active electrode 11A and the measurement passive electrode 12A. The ground electrodes 13 and 23 are connected to a ground of the power transmitting apparatus 101.

In addition, in order to block unnecessary radiation from high-voltage elements (the active electrode 11 and the measurement active electrode 11A) during power transmission, it is preferable to employ a structure in which the active electrode 11 and the measurement active electrode 11A are interposed between electrodes such as the passive electrode 12 or the ground electrodes 13 and 23. As such, by measuring the frequency characteristics, having provided the ground electrodes 13 and 23, the effects of parasitic capacitance arising between the ground electrodes 13 and 23 and the active electrodes 11 and 11A, the passive electrodes 12 and 12A are also reflected in the measured data, which makes it possible to obtain a measurement result in a state that is closer to an actual usage state.

Note that a ground electrode may be provided in the same manner in the case of measuring the frequency characteristics of the power receiving apparatus 201.

Second Embodiment

In the first embodiment, the measurement active electrode and the measurement passive electrode of the power transmission-side measurement tool are shorted when measuring the frequency characteristics. In a second embodiment, the measurement active electrode and the measurement passive electrode are connected with a capacitance interposed there between. The following will describe differences from the first embodiment.

Figure 8:
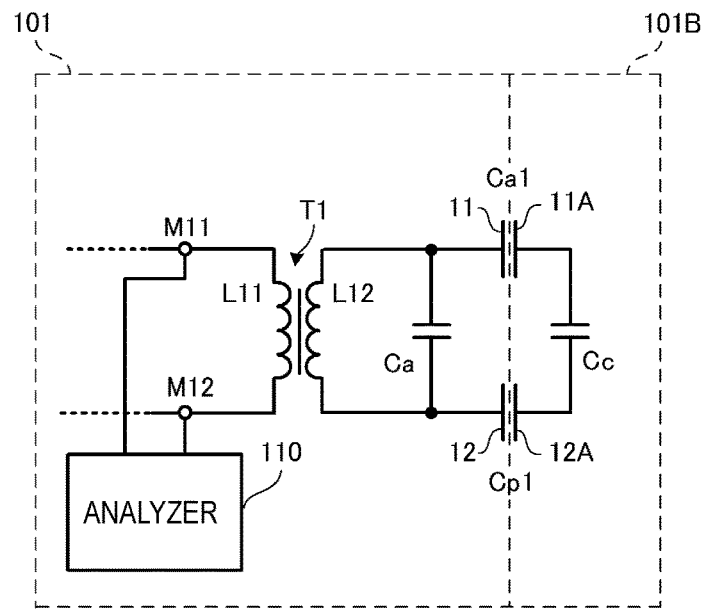
FIG. 8 is a diagram illustrating a method for measuring the frequency characteristics of a power transmitting apparatus according to a second embodiment of the present invention.

FIG. 8 is a diagram illustrating a method for measuring the frequency characteristics of the power transmitting apparatus 101 according to the second embodiment.

In the present embodiment, when measuring the resonant frequency of the power transmitting apparatus 101, a power transmission-side measurement tool 101B is placed on the power transmitting apparatus 101. The measurement active electrode 11A and the measurement passive electrode 12A of the power transmission-side measurement tool 101B are connected with a capacitance Cc interposed there between. In this state, the analyzer 110 is connected to the measurement locations M11 and M12 and the impedance frequency characteristics are measured.

Providing the capacitance Cc between the measurement active electrode 11A and the measurement passive electrode 12A makes it possible to adjust (correct) the resonance conditions of the serial resonance circuit formed in the power receiving apparatus 201. It is preferable that the Q value obtained through the measurement be a result of measurement carried out in accordance with the frequency of the transmitted power (a transmission frequency). Accordingly, providing the capacitance Cc so that the resonance conditions can be adjusted makes it possible to adjust the Q value obtained through the measurement as well. In other words, a Q value near the transmission frequency occurring when actually transmitting power can be obtained, and thus the circuit design can be carried out for the power transmitting apparatus 101 so that the efficiency is further increased during actual use.

In the case of measuring the frequency characteristics of the power receiving apparatus 201, the measurement may be carried out by connecting the measurement active electrode and the measurement passive electrode of the power reception side measurement tool described in the first embodiment with a capacitance interposed there between and connecting an analyzer to the secondary side of the step-down transformer T2, in the same manner as for the power transmitting apparatus 101 as described above.

Figure 9:
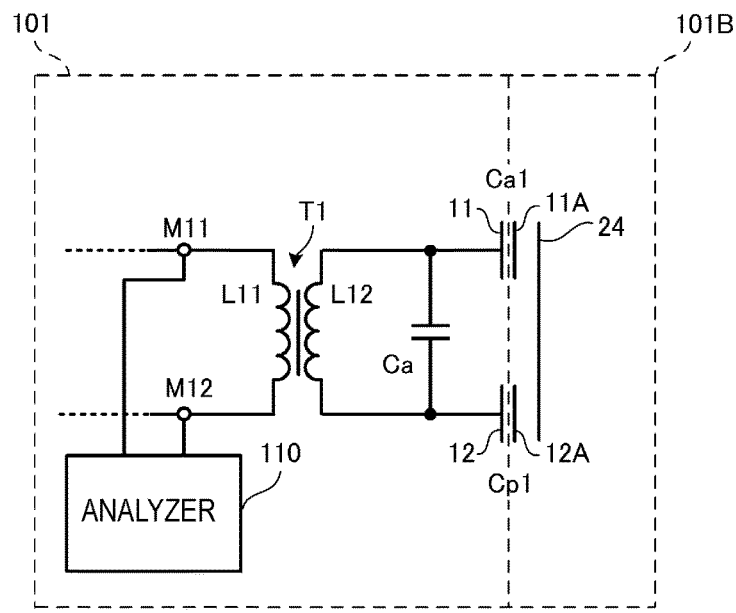
FIG. 9 is a diagram illustrating another method for measuring the frequency characteristics of a power transmitting apparatus in accordance with the present invention.

FIG. 9 is a diagram illustrating another method for measuring the frequency characteristics of the power transmitting apparatus 101.

In the present embodiment, when measuring the resonant frequency of the power transmitting apparatus 101, a capacitance connection electrode 24 is provided so as to face the measurement active electrode 11A and the measurement passive electrode 12A of the power transmission-side measurement tool 101B. Capacitances are formed between the capacitance connection electrode 24 and the measurement active electrode 11A and between the capacitance connection electrode 24 and the measurement passive electrode 12A, respectively, and thus the configuration is such that the measurement active electrode 11A and the measurement passive electrode 12A are connected with these capacitances interposed there between. In this case, wires for connecting the measurement active electrode 11A and the measurement passive electrode 12A are unnecessary, unlike the configuration illustrated in FIG. 8.

Note that measuring the frequency characteristics of the power receiving apparatus 201 can be carried out by disposing a capacitance connection electrode so as to face the measurement active electrode and the measurement passive electrode of the power reception side measurement tool.

Third Embodiment

In a measurement method according to the present embodiment, the frequency characteristics are measured by connecting an analyzer on the tool side.

Figure 10A:
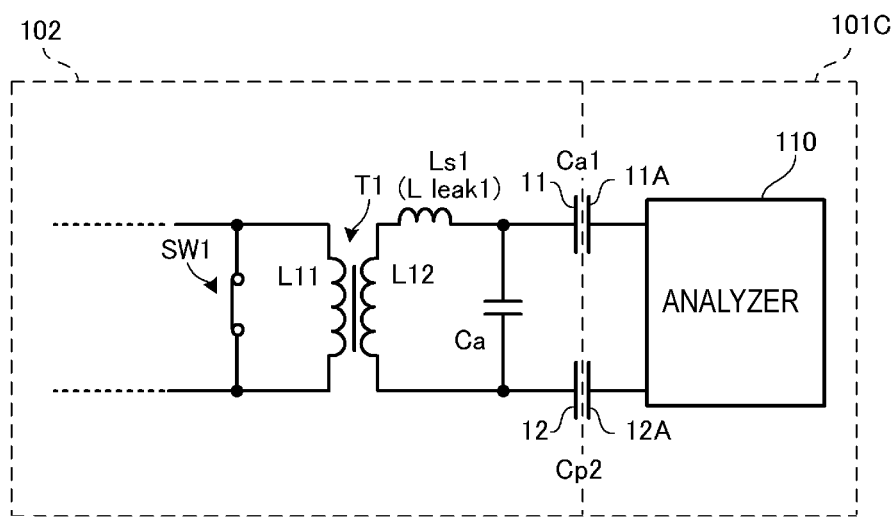
FIG. 10A is a diagram illustrating a method for measuring the frequency characteristics of a serial resonance circuit.
Figure 10B:
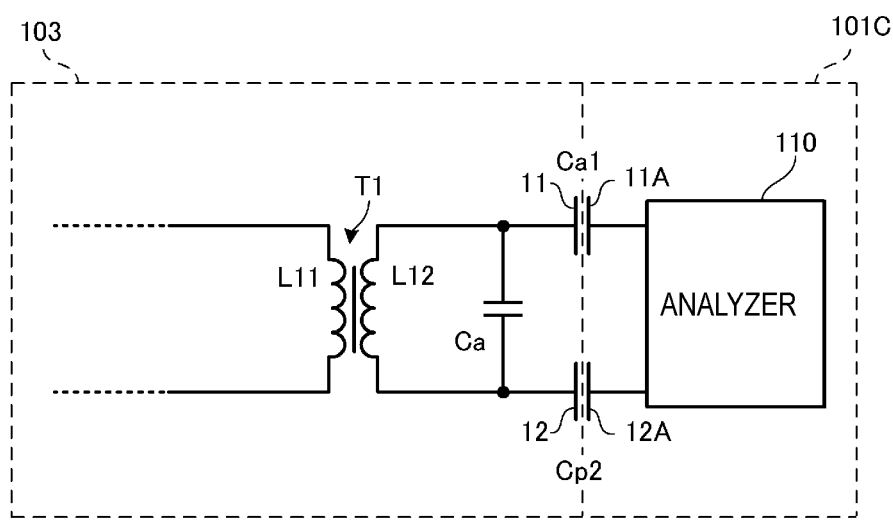
FIG. 10B is a diagram illustrating a method for measuring the frequency characteristics of a parallel resonance circuit in accordance with the present invention.

FIGS. 10A and 10B are diagrams illustrating a method for measuring the frequency characteristics of a power transmitting apparatus. FIG. 10A is a diagram illustrating a method for measuring the frequency characteristics of a serial resonance circuit, and FIG. 10B is a diagram illustrating a method for measuring the frequency characteristics of a parallel resonance circuit.

A power transmitting apparatus 102 illustrated in FIG. 10A includes a switch SW1 connected to opposite ends of the primary coil L11 in the step-up transformer T1, in addition to the same configuration as the power transmitting apparatus 101 according to the first embodiment. As described in the first embodiment, the serial resonance circuit is formed on the power transmitting apparatus 101 side by the capacitor Ca and an inductance Ls1 (or leakage inductance L leak1) inserted in series with the secondary coil L12 in the step-up transformer T1. When measuring the frequency characteristics of this serial resonance circuit, the switch SW1 is turned on (closed) and opposite ends of the primary coil L11 are shorted together. The frequency characteristics are then measured by placing a power transmission-side measurement tool 101C on the power transmitting apparatus 102.

The power transmission-side measurement tool 101C includes the measurement active electrode 11A and the measurement passive electrode 12A. The measurement active electrode 11A faces (or is in direct contact with) the active electrode 11 of the power transmitting apparatus 102, and the measurement passive electrode 12A faces (or is in direct contact with) the passive electrode 12 of the power transmitting apparatus 102. The analyzer 110 is connected to the measurement active electrode 11A and the measurement passive electrode 12A.

A power transmitting apparatus 103 illustrated in FIG. 10B has the same configuration as the power transmitting apparatus 101 according to the first embodiment. As described in the first embodiment, the parallel resonance circuit is formed on the power transmitting apparatus 101 side by the magnetization inductance of the secondary coil L12 in the step-up transformer T1 and the combined capacitance of the capacitor Ca, the capacitor Ca1, and the capacitor Cp2. When measuring the frequency characteristics of this parallel resonance circuit, it is necessary for the primary coil L11 side of the step-up transformer T1 to be open. In the present embodiment, the measurement can be carried out even in a state where the DC-AC inverter circuit and the like are connected to one another. The DC-AC inverter circuit and the like are off during the measurement. Accordingly, the DC-AC inverter circuit side is at high impedance, and almost no current flows in the elements of the DC-AC inverter circuit, such as FETs, during the measurement. Accordingly, the primary coil L11 side of the step-up transformer T1 can essentially be considered as being open even in a state where the DC-AC inverter circuit and the like are connected. The frequency characteristics are then measured by placing a power transmission-side measurement tool 101C on the power transmitting apparatus 103.

Figure 11:
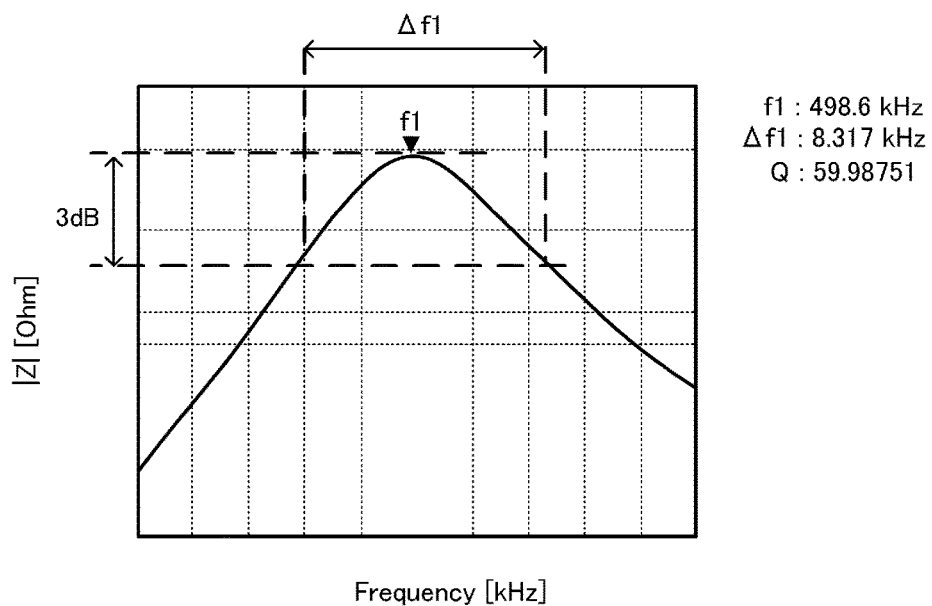
FIG. 11 is a diagram illustrating a result of measuring frequency characteristics in accordance with the present invention in the case where a power transmission-side measurement tool is used.

FIG. 11 is a diagram illustrating a result of measuring the frequency characteristics in the case where the power transmission-side measurement tool 101C is used. FIG. 11 illustrates a result of measuring the frequency characteristics of the serial resonance circuit in the power transmitting apparatus 102 illustrated in FIG. 10A.

As illustrated in FIG. 11, based on the result of measuring the frequency characteristics, the resonant frequency f1 of the serial resonance circuit is approximately 498 kHz. Meanwhile, the band width $\Delta f1$ at a point corresponding to $1/\sqrt{2}$ times a peak value (the resonant frequency f1) of the frequency characteristics (approximately −3 dB) is approximately 8.317 kHz. In this case, the Q value of the serial resonance circuit is found from $f1/\Delta f1$, and the value thereof is approximately 60.

On the basis of this measurement result, the serial resonance circuit of the power transmitting apparatus 102 is designed so that the resonant frequency f1 has error of approximately ±5% from the design target value and the measured Q value is no less than 20.

In the present embodiment, the serial resonance circuit of the power transmitting apparatus 102 is formed using leakage inductance L leak1 of the secondary coil L12 in the step-up transformer T1; however, an actual inductor component may be provided and the serial resonance circuit may be formed by that inductor and the capacitor Ca.

Figure 12:
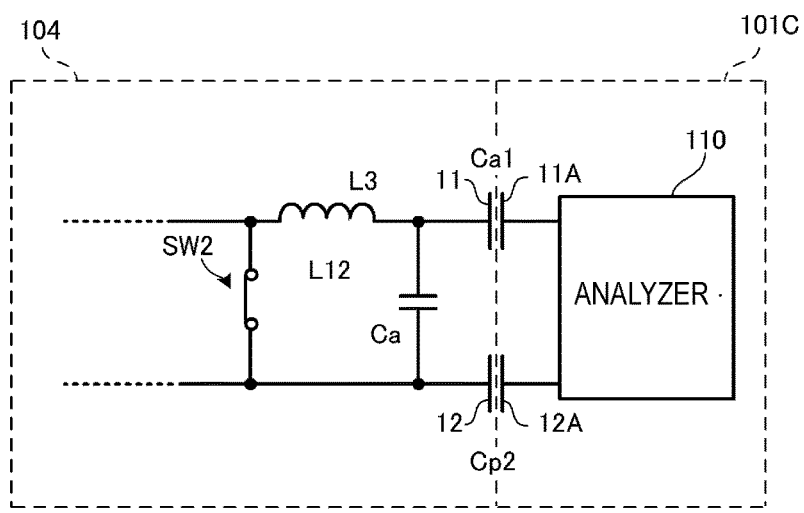
FIG. 12 is a diagram illustrating a method for measuring the frequency characteristics of a power transmitting apparatus in the case where a step-up transformer is not used in a serial resonance circuit.

FIG. 12 is a diagram illustrating a method for measuring the frequency characteristics of a power transmitting apparatus in the case where a step-up transformer is not used as part of the serial resonance circuit.

In this example, a power transmitting apparatus 104 is provided with the capacitor Ca and an inductor L3 that form the serial resonance circuit, and includes a switch SW2 that connects one end of the inductor L3 to a reference potential. When measuring the frequency characteristics of this serial resonance circuit, the switch SW2 is turned on (closed). The frequency characteristics are then measured by placing a power transmission-side measurement tool 101C on the power transmitting apparatus 104.

Next, a method of measuring the frequency characteristics of a power receiving apparatus by connecting an analyzer on the tool side will be described.

Figure 13A:
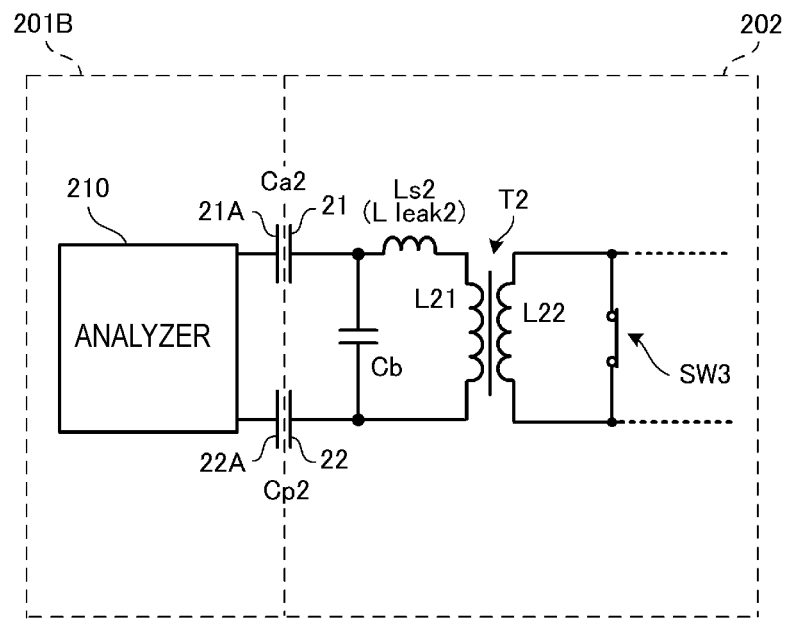
FIG. 13A is a diagram illustrating a method for measuring the frequency characteristics of a serial resonance circuit in accordance with the present invention.
Figure 13B:
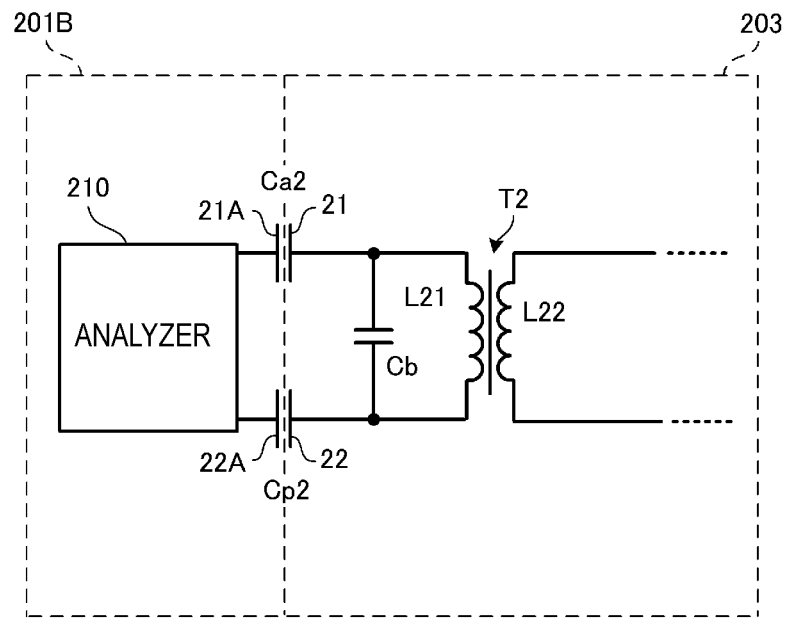
FIG. 13B is a diagram illustrating a method for measuring the frequency characteristics of a parallel resonance circuit in accordance with the present invention.

FIGS. 13A and 13B are diagrams illustrating a method for measuring the frequency characteristics of a power receiving apparatus. FIG. 13A is a diagram illustrating a method for measuring the frequency characteristics of a serial resonance circuit, and FIG. 13B is a diagram illustrating a method for measuring the frequency characteristics of a parallel resonance circuit.

A power receiving apparatus 202 illustrated in FIG. 13A includes a switch SW3 connected to opposite ends of the secondary coil L22 in the step-down transformer T2, in addition to the same configuration as the power receiving apparatus 201 according to the first embodiment. As described in the first embodiment, the serial resonance circuit is formed on the power receiving apparatus 201 side by the capacitor Cb and an inductance Ls2 (or leakage inductance L leak2) inserted in series with the primary coil L21 in the step-down transformer T2. When measuring the frequency characteristics of this serial resonance circuit, the switch SW3 is turned on and opposite ends of the secondary coil L22 are shorted together. The frequency characteristics are then measured by setting a power reception side measurement tool 201B for the power receiving apparatus 202.

A power receiving apparatus 203 illustrated in FIG. 13B has the same configuration as the power receiving apparatus 201 according to the first embodiment. As described in the second embodiment, the parallel resonance circuit on the power receiving apparatus 203 side is formed by the capacitor Cb and the primary coil L21 of the step-down transformer T2. When measuring the frequency characteristics of this parallel resonance circuit, it is necessary for the secondary coil L22 of the step-down transformer T2 to be open. In the present embodiment, the measurement can be carried out even in a state where a rectifying circuit such as the diode bridge DB is connected. If, during the measurement, the voltage inputted to the diodes that constitute the diode bridge DB is lower than a threshold voltage of the diodes, the diode will be at high impedance, and the load circuit RL side will also be at high impedance as a result; almost no current will flow in the elements of the rectifying circuit such as the diodes, and the rectifying circuit side can essentially be considered as being open. The frequency characteristics are then measured by setting the power reception side measurement tool 201B for the power receiving apparatus 203.

Figure 14:
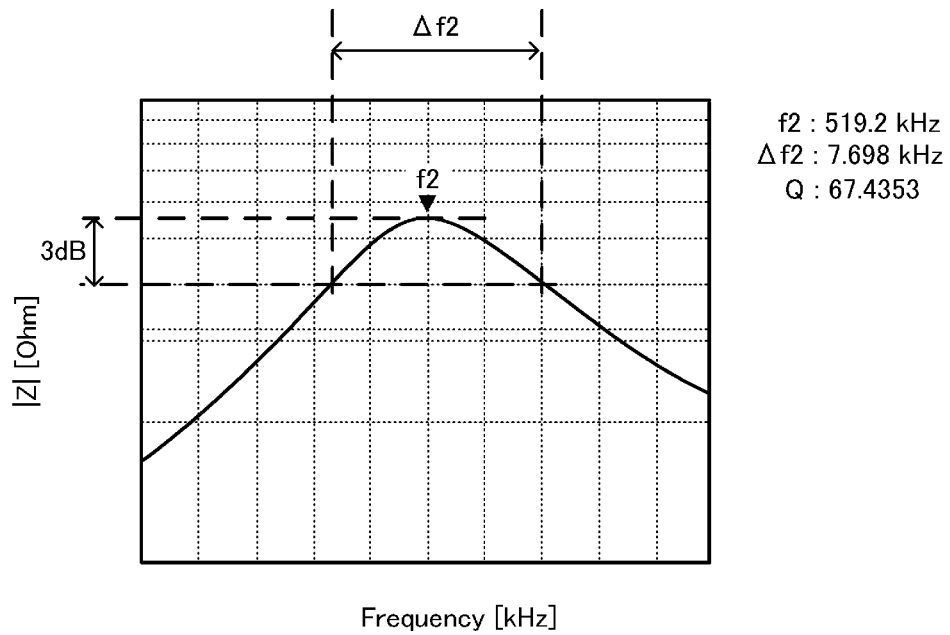
FIG. 14 is a diagram illustrating a result of measuring the frequency characteristics of the power receiving apparatus indicated in FIG. 13B.

FIG. 14 is a diagram illustrating a result of measuring the frequency characteristics of the power receiving apparatus 203 indicated in FIG. 13B. As illustrated in FIG. 14, the resonant frequency f2 of the parallel resonance circuit is approximately 519 kHz. Meanwhile, the band width Δf2 at a point corresponding to $1/\sqrt{2}$ times a peak value (the resonant frequency f2) of the frequency characteristics (approximately −3 dB) is approximately 7.698 kHz. In this case, the Q value of the serial resonance circuit is found from f2/Δf2, and the value thereof is approximately 67.

On the basis of this measurement result, the serial resonance circuit of the power transmitting apparatus 102 is designed so that the resonant frequency f2 has error of approximately ±5% from the design target value and the measured Q value is no less than 20.

Note that when measuring the frequency characteristics, the opposing active electrodes and passive electrodes may be interposed between ground electrodes.

Figure 15:
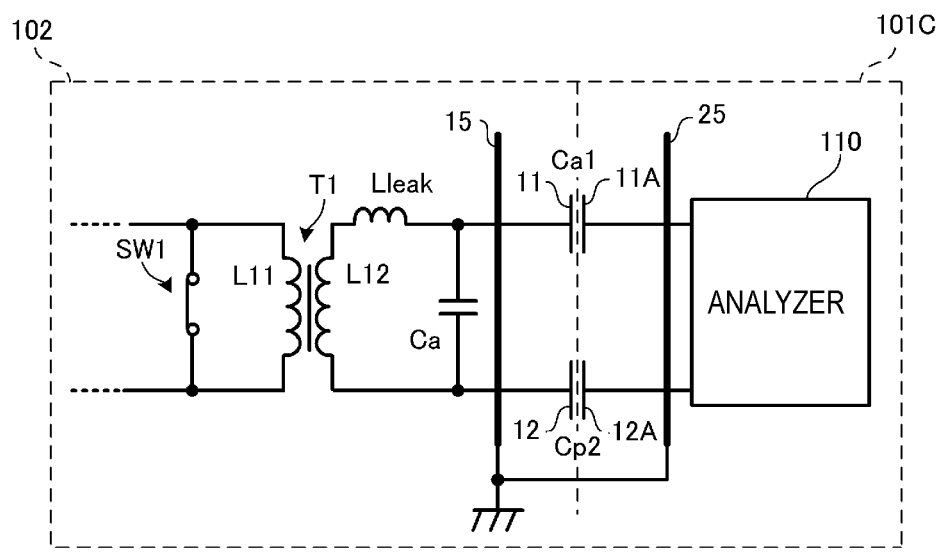
FIG. 15 is a diagram illustrating a method for measuring frequency characteristics using a ground electrode in accordance with the present invention.
Figure 16:
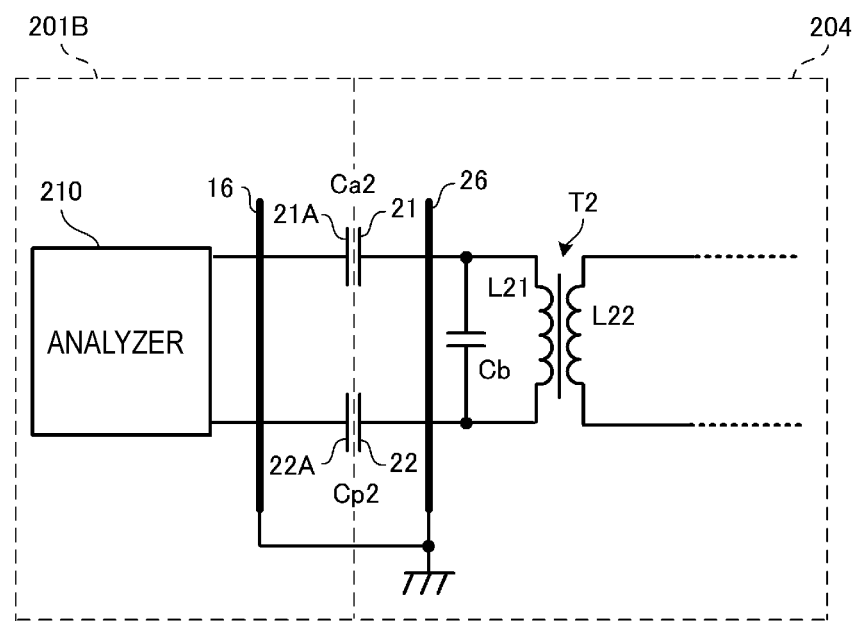
FIG. 16 is a diagram illustrating a method for measuring frequency characteristics in accordance with the present invention using a ground electrode.

FIGS. 15 and 16 are diagrams illustrating a method for measuring frequency characteristics using a ground electrode.

The power transmitting apparatus 102 illustrated in FIG. 15 includes a ground electrode 15 provided facing the active electrode 11 and the passive electrode 12. Meanwhile, the power transmission-side measurement tool 101C includes a ground electrode 25 provided facing the measurement active electrode 11A and the measurement passive electrode 12A. The ground electrodes 15 and 25 are connected to a ground of the power transmitting apparatus 102.

Meanwhile, a power receiving apparatus 204 includes a ground electrode 26 provided facing the active electrode 21 and the passive electrode 22. The power reception side measurement tool 201B includes a ground electrode 16 provided facing the measurement active electrode 21A and the measurement passive electrode 22A. The ground electrodes 16 and 26 are connected to a ground of the power receiving apparatus 204.

In the power receiving apparatus 204 illustrated in FIG. 16, the parallel resonance circuit is formed by the capacitor Cb and the magnetization inductance of the primary coil L21 in the step-down transformer T2. As described with reference to FIG. 13B, when measuring the frequency characteristics of this parallel resonance circuit, the diode bridge DB side can be considered as being open even in a state where the diode bridge DB and the like are connected. The frequency characteristics are then measured by setting the power reception side measurement tool 201B for the power receiving apparatus 204.

In an actual usage state, high-voltage elements are surrounded by electrodes in order to block unnecessary radiation from those high-voltage elements. As such, by measuring the frequency characteristics having provided the ground electrodes 15 and 25 (the ground electrodes 16 and 26), it is possible to obtain a measurement result in a state that is closer to an actual usage state.

The invention claimed is:

1. A method for measuring frequency characteristics of a power transmitting apparatus having an AC generating circuit, a power transmission resonance circuit connected to the AC generating circuit, and first and second electrodes connected to an output side of the power transmission resonance circuit, the method comprising:
    placing a power transmission side measurement tool having first and second measurement electrodes in operational engagement with the first and second electrodes, respectively, whereby the power transmission side measurement tool is in operational engagement with the power transmission apparatus; and
    while the power transmission side measurement tool is in operational engagement with the power transmission apparatus, measuring the frequency characteristics of the power transmission resonance circuit at a location between the AC generating circuit and the power transmission resonance circuit.

2. The method according to claim 1, wherein the frequency characteristics are a resonant frequency of the power transmission resonance circuit and a Q value.

3. The method according to claim 1, wherein the first and second measurement electrodes are shorted together.

4. The method according to claim 1, wherein the first and second measurement electrodes are connected to each other with a capacitance interposed there between.

5. The method according to claim 1, wherein the first and second electrodes and the first and second measurement electrodes are interposed between a power transmission side ground electrode which is provided in the power transmitting apparatus and which is connected to a ground potential of the power transmitting apparatus and a tool-side ground electrode provided in the power transmission side measurement tool and connected to a ground potential of the power transmitting apparatus.

6. The method according to claim 1, wherein the power transmitting side measurement tool does not include any resonance circuits.

7. A method for measuring the frequency characteristics of a power receiving apparatus having first and second electrodes, a power reception resonance circuit having an input side connected to the first and second electrodes, and a rectifying circuit connected to an output side of the power reception resonance circuit, the method comprising:
    placing a power reception side measurement tool having first and second measurement electrodes in operational engagement with the first and second electrodes, respectively, whereby the power reception side measurement tool is in operational engagement with the power receiving apparatus; and
    while the power reception side measurement tool is in operational engagement with the power receiving apparatus, measuring the frequency characteristics of the power reception resonance circuit at a location between the power reception resonance circuit and the rectifying circuit.

8. The method according to claim 7, wherein the frequency characteristics are a resonant frequency of the power reception resonance circuit and a Q value.

9. The method according to claim 7, wherein the first and second measurement electrodes are shorted together.

10. The method according to claim 7, wherein the first and second measurement electrodes are connected with a capacitance interposed there between.

11. The method according to claim 7, wherein the first and second electrodes and the first and second measurement electrodes are interposed between a power reception side ground electrode which is provided in the power receiving apparatus and which is connected to a ground potential of the power receiving apparatus and a power reception side measurement tool ground electrode provided in the power reception side measurement tool and which is connected to the ground potential of the power receiving apparatus.

12. The method according to claim 7, wherein the power reception side measurement tool does not include any resonance circuits.

13. A method for measuring frequency characteristics of a power transmitting apparatus having an AC generating circuit, serial resonance circuit having first and second input ends connected to the AC generating circuit, and first and second electrodes connected to an output side of the serial resonance circuit, the method comprising:
placing a power transmission side measurement tool having first and second measurement electrodes in operational engagement with the first and second electrodes, respectively, whereby the power transmission side measurement tool is in operational engagement with the power transmission apparatus and the first and second input ends of the serial resonance circuit are connected; and
while the power transmission side measurement tool is in operational engagement with the power transmission apparatus, measuring the frequency characteristics of the serial resonance circuit at a location between the first and second measurement electrodes.

14. The method according to claim 13, wherein the frequency characteristics are a resonant frequency of the serial resonance circuit and a Q value.

15. The method according to claim 13, wherein the first and second measurement electrodes are shorted together.

16. The method according to claim 13, wherein the first and second input ends of the serial resonance circuit are connected with a capacitance interposed there between.

17. The method according to claim 13, wherein the power transmitting side measurement tool does not include any resonance circuits.

18. A method for measuring frequency characteristics of a power transmitting apparatus having an AC generating circuit, a parallel resonance circuit having first and second input ends connected to the AC generating circuit, and first and second electrodes connected to an output side of the parallel resonance circuit, the method comprising:
placing a power transmission side measurement tool having first and second measurement electrodes in operational engagement with the first and second electrodes, respectively, whereby the power transmission side measurement tool is in operational engagement with the power transmission apparatus; and
while the power transmission side measurement tool is in operational engagement with the power transmission apparatus, measuring a frequency of the parallel resonance circuit at a location between the first and second measurement electrodes.

19. The method according to claim 18, wherein the frequency characteristics are a resonant frequency of the parallel resonance circuit and a Q value.

20. The frequency characteristic measurement method according to claim 18, wherein the first and second electrodes and the first and second measurement electrodes are interposed between a power transmission side ground electrode which is provided in the power transmitting apparatus and which is connected to a ground potential of the power transmitting apparatus and a tool-side ground electrode provided in the power transmission side measurement tool and connected to the ground potential of the power transmitting apparatus.

21. The method according to claim 18, wherein the power transmitting side measurement tool does not include any resonance circuits.

22. A method for measuring the frequency characteristics of a power receiving apparatus having first and second electrodes, a serial resonance circuit connected to the first and second electrodes, and a rectifying circuit connected to first and second output ends of the serial resonance circuit, the method comprising:
placing a power reception side measurement tool having first and second measurement electrodes in operational engagement with the first and second electrodes, respectively, whereby the power reception side measurement tool is in operational engagement with the power receiving apparatus; and
while the power reception side measurement tool is in operational engagement with the power receiving apparatus, measuring the frequency characteristics of the serial resonance circuit at a location between the first and second measurement electrodes.

23. The method according to claim 22, wherein the frequency characteristics are a resonant frequency of the serial resonance circuit and a Q value.

24. The method according to claim 22, wherein the first and second measurement electrodes are shorted together.

25. The method according to claim 22, wherein the first and second output ends of the serial resonance circuit are connected with a capacitance interposed there between.

26. The method according to claim 22, wherein the power reception side measurement tool does not include any resonance circuits.

27. A method for measuring frequency characteristics of a power receiving apparatus having first and second electrodes, a parallel resonance circuit connected to the first and second electrodes and a rectifying circuit connected to first and second output ends of the parallel resonance circuit, the method comprising:
placing a power reception side measurement tool having first and second measurement electrodes in operational engagement with the first and second electrodes, respectively, whereby the power receiving side measurement tool is in operational engagement with the power receiving apparatus; and
while the power reception side measurement tool is in operational engagement with the power receiving apparatus, measuring the frequency of the parallel resonance circuit at a location between the first and second electrodes.

28. The method according to claim 27, wherein the frequency characteristics are a resonant frequency of the parallel resonance circuit and a Q value.

29. The method according to claim 27, wherein the first and second electrodes and the first and second measurement electrodes are interposed between a power receiving side ground electrode which is provided in the power transmitting apparatus and which is connected to a ground potential of the power receiving apparatus and a power receiving side measurement tool ground electrode provided in the power reception side measurement tool and which is connected to the ground potential of the power receiving apparatus.

30. The method according to claim 27, wherein the power reception side measurement tool does not include any resonance circuits.

\* \* \* \* \*